(12) United States Patent
Le et al.

(10) Patent No.: US 10,862,022 B2
(45) Date of Patent: Dec. 8, 2020

(54) SPIN-TRANSFER TORQUE MRAM WITH MAGNETICALLY COUPLED ASSIST LAYERS AND METHODS OF OPERATING THE SAME

(71) Applicant: SANDISK TECHNOLOGIES LLC, Addison, TX (US)

(72) Inventors: Quang Le, San Jose, CA (US); Zhanjie Li, Pleasanton, CA (US); Zhigang Bai, Fremont, CA (US); Paul Vanderheijden, Cupertino, CA (US); Michael Ho, Redwood City, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 50 days.

(21) Appl. No.: 16/212,342

(22) Filed: Dec. 6, 2018

(65) Prior Publication Data

US 2020/0185595 A1 Jun. 11, 2020

(51) Int. Cl.
*G11C 7/00* (2006.01)
*H01L 43/02* (2006.01)
(Continued)

(52) U.S. Cl.
CPC ............ *H01L 43/02* (2013.01); *G11C 11/161* (2013.01); *H01F 10/3254* (2013.01);
(Continued)

(58) Field of Classification Search
CPC ........ H01L 43/02; H01L 43/10; H01L 27/222
(Continued)

(56) References Cited

U.S. PATENT DOCUMENTS 7,813,202 B2 * 10/2010 Rodmacq ............ H01F 10/3236
365/209
7,826,258 B2 11/2010 Zhu et al.
(Continued)

FOREIGN PATENT DOCUMENTS

EP 2209123 A1 7/2010
JP 2005150482 A 6/2005

OTHER PUBLICATIONS

Notification of Transmittal of the International Search Report and Written Opinion of the International Search Authority or International Patent Application No. PCT/US2019/049189, dated Dec. 19, 2019, 16 pages.
(Continued)

*Primary Examiner* — Hoai V Ho
*Assistant Examiner* — Minh Dinh
(74) *Attorney, Agent, or Firm* — The Marbury Law Group, PLLC

(57) ABSTRACT

A MRAM device includes a magnetic tunnel junction containing a reference layer having a fixed magnetization direction, a free layer, and a nonmagnetic tunnel barrier layer located between the reference layer and the free layer, a first magnetic assist layer, a second magnetic assist layer, an antiferromagnetic coupling spacer layer located between the first and second magnetic assist layers, and a first nonmagnetic spacer layer located between the free layer and the first magnetic assist layer. The antiferromagnetic coupling spacer layer is configured to provide antiferromagnetic coupling between a first magnetization direction of the first magnetic assist layer and a second magnetization direction of the second magnetic assist layer.

25 Claims, 8 Drawing Sheets

(51) Int. Cl.
*H01F 10/32* (2006.01)
*H01L 43/10* (2006.01)
*G11C 11/16* (2006.01)
*H01L 27/22* (2006.01)

(52) U.S. Cl.
CPC ....... *H01F 10/3268* (2013.01); *H01L 27/222* (2013.01); *H01L 43/10* (2013.01); *G11C 11/1655* (2013.01); *G11C 11/1657* (2013.01); *G11C 11/1673* (2013.01)

(58) Field of Classification Search
USPC ........................................................ 365/158
See application file for complete search history.

(56) References Cited

U.S. PATENT DOCUMENTS

| | | |
|---|---|---|
| 8,085,582 B2 | 12/2011 | Nakamura et al. |
| 8,357,982 B2 | 1/2013 | Kajiyama |
| 8,569,852 B2 | 10/2013 | Morise et al. |
| 8,716,817 B2 | 5/2014 | Saida et al. |
| 8,860,156 B2 | 10/2014 | Beach et al. |
| 8,917,543 B2 | 12/2014 | Ranjan et al. |
| 9,019,758 B2 | 4/2015 | Huai et al. |
| 9,025,368 B2 | 5/2015 | Saida et al. |
| 9,025,371 B1 | 5/2015 | Huai et al. |
| 9,166,150 B2 | 10/2015 | Doyle et al. |
| 9,281,040 B2 | 3/2016 | Soree et al. |
| 9,318,179 B2 | 4/2016 | Huai et al. |
| 9,419,210 B2 | 8/2016 | Huai et al. |
| 9,437,808 B2 | 9/2016 | Doyle et al. |
| 9,444,039 B2 | 9/2016 | Huai et al. |
| 9,460,397 B2 | 10/2016 | Apalkov et al. |
| 9,461,243 B2 | 10/2016 | Guo |
| 9,478,729 B2 | 10/2016 | Lee et al. |
| 9,537,090 B1 | 1/2017 | Hu |
| 9,620,706 B2 | 4/2017 | Lee et al. |
| 9,741,929 B2 | 8/2017 | Guo |
| 9,852,782 B2 | 12/2017 | Braganca et al. |
| 9,853,206 B2 | 12/2017 | Pinarbasi et al. |
| 9,978,935 B2 | 5/2018 | Hu |
| 10,270,027 B1 | 4/2019 | Gajek et al. |
| 2002/0105823 A1 | 8/2002 | Redon et al. |
| 2007/0133263 A1* | 6/2007 | Haratani ................ H01L 43/08 365/158 |
| 2009/0015958 A1 | 1/2009 | Nakamura et al. |
| 2009/0218645 A1 | 9/2009 | Ranjan et al. |
| 2011/0007560 A1 | 1/2011 | Dieny et al. |
| 2011/0233697 A1 | 9/2011 | Kajiyama |
| 2012/0063218 A1 | 3/2012 | Huai et al. |
| 2012/0242438 A1 | 9/2012 | Morise et al. |
| 2012/0314490 A1 | 12/2012 | Okhi et al. |
| 2013/0069185 A1 | 3/2013 | Saida et al. |
| 2013/0181305 A1 | 7/2013 | Nakayama et al. |
| 2013/0258764 A1 | 10/2013 | Ranjan et al. |
| 2014/0070341 A1 | 3/2014 | Beach et al. |
| 2014/0110804 A1* | 4/2014 | Han .................. H01L 43/02 257/421 |
| 2014/0159175 A1 | 6/2014 | Lee et al. |
| 2014/0160835 A1 | 6/2014 | Soree et al. |
| 2014/0177326 A1 | 6/2014 | Doyle et al. |
| 2014/0217487 A1 | 8/2014 | Guo |
| 2014/0269037 A1 | 9/2014 | Saida et al. |
| 2015/0001656 A1 | 1/2015 | Beach et al. |
| 2015/0097159 A1 | 4/2015 | Apalkov et al. |
| 2015/0137293 A1 | 5/2015 | Huai et al. |
| 2015/0188035 A1 | 7/2015 | Huai et al. |
| 2015/0188036 A1 | 7/2015 | Huai et al. |
| 2015/0214275 A1 | 7/2015 | Hsueh et al. |
| 2015/0340595 A1 | 11/2015 | Lee et al. |
| 2016/0043302 A1 | 2/2016 | Doyle et al. |
| 2016/0155931 A1 | 6/2016 | Lee et al. |
| 2016/0197269 A1 | 7/2016 | Huai et al. |
| 2016/0315249 A1* | 10/2016 | Kardasz ................ G11C 11/161 |
| 2016/0336508 A1 | 11/2016 | Guo |
| 2016/0372656 A1 | 12/2016 | Pinarbasi et al. |
| 2016/0379698 A1 | 12/2016 | Saida et al. |
| 2016/0380188 A1 | 12/2016 | Hu |
| 2017/0062700 A1 | 3/2017 | Braganca et al. |
| 2017/0084830 A1 | 3/2017 | Hu |
| 2017/0294573 A1 | 10/2017 | Hu et al. |
| 2017/0372763 A1 | 12/2017 | Braganca et al. |
| 2018/0033954 A1 | 2/2018 | Aradhya et al. |
| 2018/0108391 A1 | 4/2018 | Braganca et al. |
| 2019/0103552 A1* | 4/2019 | Shiokawa ........... H01L 21/8239 |
| 2019/0131517 A1 | 5/2019 | Shiokawa et al. |
| 2019/0165253 A1* | 5/2019 | Sun ................... H01L 43/08 |
| 2019/0207089 A1* | 7/2019 | Kardasz ............. H01F 10/3286 |
| 2020/0011943 A1* | 1/2020 | Zimmer .................. H01L 43/10 |

OTHER PUBLICATIONS

Liu, T. et al., "Large Enhanced Perpendicular Magnetic Anisotropy in CoFeb/MgO System with the Typical Ta Buffer Replaced by an Hf Layer," AIP Advances, vol. 2, No. 032151, pp. 032151-1 to 032151-7, (2012).

Ma, Z. et al., "Effect of 90 degree Domain Movement on the Piezoelectric Response of Patterned $PbZr_{0.2}Ti_{0.8}O_3/SrTiO_3/Si$ Heterostructures," Appl. Phys. Lett., vol. 87, No. 7, (Abstract Only), (2005), https://doi.org/10.1063/1.2012527.

Hunter, D. et al., "Giant magnetostriction in annealed $Co_{1-x}Fe_x$ thin-films," Nature Communications, Received May 25, 2011, Accepted Oct. 4, 2011, Published Nov. 1, 2011, DOI: 10.1038/ncomms1529, pp. 1-7, (2011).

Parkin, et al., "Systematic Variation of the Strength and Oscillation Period of Indirect Magnetic Exchange Coupling Through the 3d, 4d and 5d Transition Metals," Phys. Rev. Lett., vol. 67, No. 3598, (Abstract Only) (1991), https://doi.org/10.1103/PhysRevLett.67.3598.

Sambri, A. et al., "Epitaxial Piezoelectric Pb(Zr0.2Ti0.8)O3 Thin Films on Silicon for Energy Harvesting Devices," Smart Materials Research, vol. 2012, Article ID 426048, pp. 1-7, (2012).

U.S. Appl. No. 15/701,761, filed Sep. 12, 2017, SanDisk Technologies LLC.

U.S. Appl. No. 15/728,840, filed Oct. 10, 2017, SanDisk Technologies LLC.

U.S. Appl. No. 16/024,490, filed Jun. 29, 2018, SanDisk Technologies LLC.

U.S. Appl. No. 16/024,521, filed Jun. 29, 2018, SanDisk Technologies LLC.

U.S. Appl. No. 16/212,132, filed Dec. 6, 2018, SanDisk Technologies LLC.

U.S. Appl. No. 16/212,257, filed Dec. 6, 2018, SanDisk Technologies LLC.

U.S. Appl. No. 16/212,420, filed Dec. 6, 2018, SanDisk Technologies LLC.

Notification of Transmittal of the International Search Report and Written Opinion of the International Search Authority for International Patent Application No. PCT/US2019/046783, dated Dec. 3, 2019, 10 pages.

USPTO Office Communication, Non-Final Office Action for U.S. Appl. No. 16/212,257, dated Dec. 13, 2019, 16 pages.

USPTO Office Communication, Non-Final Office Action for U.S. Appl. No. 16/212,132, dated Nov. 29, 2019, 12 pages.

USPTO Office Communication, Non-Final Office Action for U.S. Appl. No. 16/212,420, dated Nov. 27, 2019, 10 pages.

Non-Final Office Action for U.S. Appl. No. 16/902,641, dated Jul. 9, 2020, 14 pages.

* cited by examiner

SPIN-TRANSFER TORQUE MRAM WITH MAGNETICALLY COUPLED ASSIST LAYERS AND METHODS OF OPERATING THE SAME

FIELD

The present disclosure relates generally to the field of magnetic memory devices and specifically to a spin-transfer torque (STT) magnetoresistive random access memory (MRAM) device with magnetically coupled assist layers and methods of operating the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing torque to magnetize the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of a reference layer.

SUMMARY

According to an aspect of the present disclosure, a MRAM device includes a magnetic tunnel junction containing a reference layer having a fixed magnetization direction, a free layer, and a nonmagnetic tunnel barrier layer located between the reference layer and the free layer, a first magnetic assist layer, a second magnetic assist layer, an antiferromagnetic coupling spacer layer located between the first and second magnetic assist layers, and a first nonmagnetic spacer layer located between the free layer and the first magnetic assist layer. The antiferromagnetic coupling spacer layer is configured to provide antiferromagnetic coupling between a first magnetization direction of the first magnetic assist layer and a second magnetization direction of the second magnetic assist layer.

DETAILED DESCRIPTION

Figure 1:
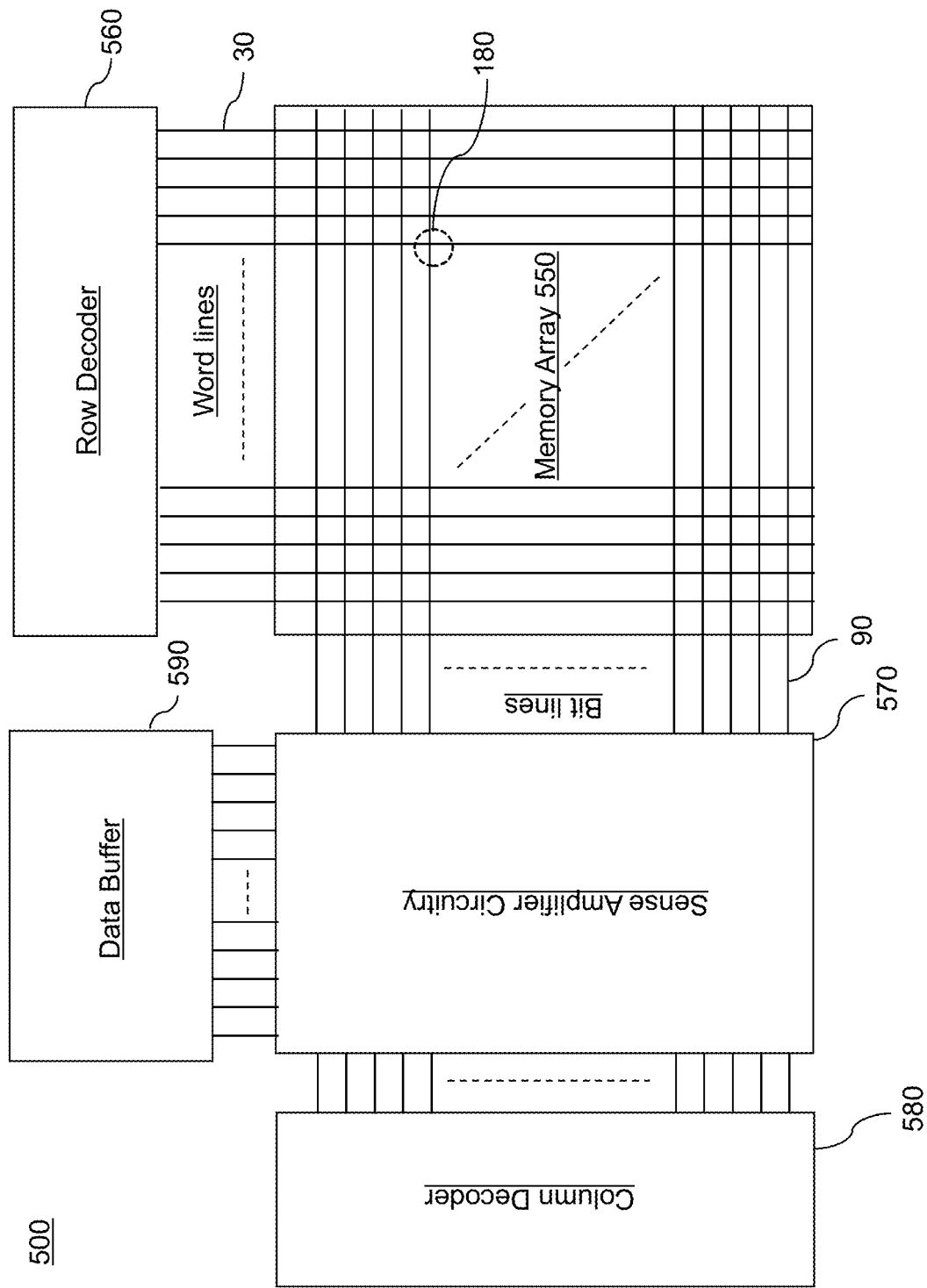
FIG. 1 is a schematic diagram of a memory device including resistive memory cells of the present disclosure in an array configuration.

As discussed above, the present disclosure is directed to a spin-transfer torque (STT) MRAM device with magnetically coupled assist layers and methods of operating the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

Referring to FIG. 1, a schematic diagram is shown for a magnetic memory device including memory cells 180 of an embodiment present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
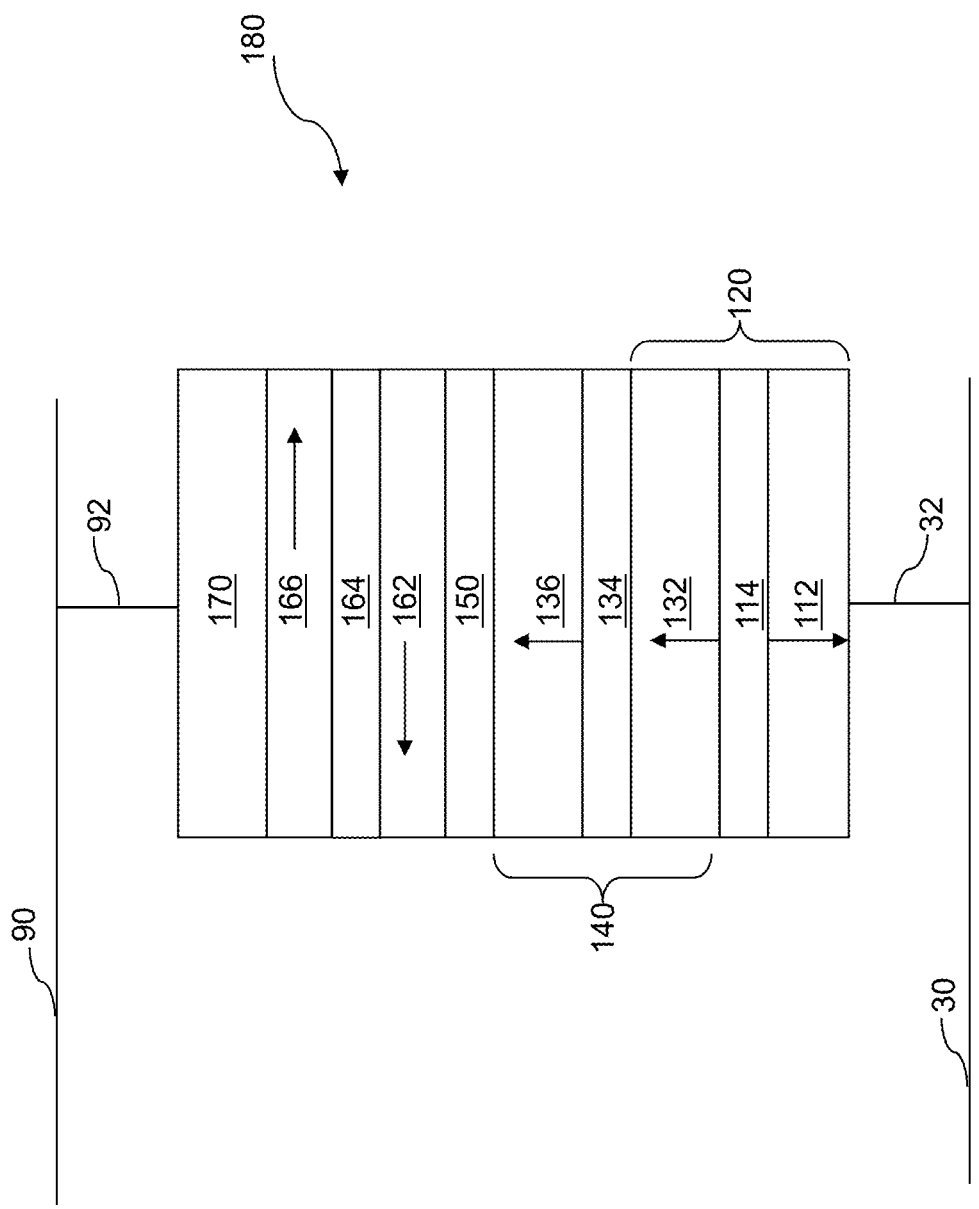
FIG. 2 illustrates a first configuration of an exemplary STT MRAM cell according to an embodiment of the present disclosure.

Referring to FIG. 2, a first configuration of an exemplary STT MRAM cell 180 is schematically illustrated. The STT MRAM cell 180 includes a magnetic tunnel junction (MTJ) 140. The magnetic tunnel junction 140 includes a reference layer 132 having a fixed vertical magnetization, a nonmagnetic tunnel barrier layer 134 located between the reference layer 132 and the free layer 136. In one embodiment, the reference layer 132 is located below the nonmagnetic tunnel barrier layer 134, while the free layer 136 is located above the nonmagnetic tunnel barrier layer 134. However, in other embodiments, the reference layer 132 is located above the nonmagnetic tunnel barrier layer 134, while the free layer 136 is located below the nonmagnetic tunnel barrier layer 134, or the reference layer 132 and the free layer 136 may be located on opposite lateral sides nonmagnetic tunnel barrier layer 134. In one embodiment, the reference layer 132 and the free layer 136 have respective positive uniaxial magnetic anisotropy.

Generally, a magnetic thin film has magnetic energy per unit volume that depends on the orientation of the magnetization of the material within the magnetic thin film. The magnetic energy per unit volume can be approximated by a polynomial of the angle $\theta$ (or of $\sin^2\theta$) between the direction of the magnetization and the vertical axis that is perpendicular to the plane of the magnetic thin film (such as a top surface or a bottom surface of the magnetic thin film) and the azimuthal angle $\phi$ between the direction of magnetization and a fixed vertical plane that is perpendicular to the plane of the magnetic thin film. The first and second order terms for the magnetic energy per unit volume as a function of $\sin^2\theta$ includes $K_1 \sin^2\theta + K_2 \sin^4\theta$. When $K_1$ is negative and $K_2$ is less than $-K_1/2$, the function $K_1 \sin^2\theta + K_2 \sin^4\theta$ has a minimum when $\theta$ is at $\pi/2$. If the magnetic anisotropy energy as a function of $\theta$ has a minimum only when $\theta$ is at $\pi/2$, the magnetization of the magnetic film prefers to stay entirely within the plane of the film, and the film is said to have "negative uniaxial magnetic anisotropy." If the magnetic anisotropy energy as a function of $\theta$ has a minimum only when $\theta$ is at 0 or $\pi$, the magnetization of the magnetic film is perpendicular to the plane of the film, and the film is said to have "positive uniaxial magnetic anisotropy." A thin crystalline magnetic film having positive uniaxial magnetic anisotropy has a tendency for magnetization to stay perpendicular to the plane of the thin crystalline magnetic film, i.e., perpendicular to the two directions along which the thin crystalline magnetic film laterally extends. A thin crystalline magnetic film having negative uniaxial magnetic anisotropy has a magnetization within the plane of the thin crystalline magnetic film although within the film plane magnetization doesn't have a preferred orientation.

The configuration in which the reference layer 132 and the free layer 136 have respective positive uniaxial magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

The reference layer 132 can include either a Co/Ni or Co/Pt multilayer structure. The reference layer 132 can additionally include a thin non-magnetic layer comprised of tantalum having a thickness of 0.2 nm 0.5 nm and a thin CoFeB layer (having a thickness in a range from 0.5 nm to 3 nm). The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm. The free layer 136 can includes alloys of one or more of Fe, Co, and/or Ni, such as CoFeB, at a composition that provides positive uniaxial magnetic anisotropy.

In one embodiment, the reference layer 132 may be provided as a component within a synthetic antiferromagnetic structure (SAF structure) 120. The SAF structure 120 can include the reference layer 132, a fixed ferromagnetic layer 112 having a magnetization that is antiparallel to the fixed vertical magnetization, and an antiferromagnetic coupling layer 114 located between the reference layer 132 and the fixed ferromagnetic layer 112 facing the first side of the reference layer 132 opposite to the second side of the reference layer 132 which faces the nonmagnetic tunnel barrier layer 134. The antiferromagnetic coupling layer 114 has a thickness that induces an antiferromagnetic coupling between the reference layer 132 and the fixed ferromagnetic layer 112. In other words, the antiferromagnetic coupling layer 114 can lock in the antiferromagnetic alignment between the magnetization of the reference layer 132 and the magnetization of the fixed ferromagnetic layer 112 to lock in place the magnetizations of the reference layer 132 and the magnetization of the fixed ferromagnetic layer 112. In one embodiment, the antiferromagnetic coupling layer can include ruthenium and can have a thickness in a range from 0.3 nm to 1 nm.

A first nonmagnetic spacer layer 150 is provided over the second side of the free layer 136 opposite to the first side of the free layer 136 which faces the nonmagnetic tunnel barrier layer 134. The first nonmagnetic spacer layer 150 includes a nonmagnetic material such as tantalum, ruthenium, tantalum nitride, copper, copper nitride, or magnesium oxide. In one embodiment, the first nonmagnetic spacer layer 150 can include an electrically conductive metallic material. Alternatively, the first nonmagnetic spacer layer 150 can include a tunneling dielectric material such as magnesium oxide. The thickness of the first nonmagnetic spacer layer 150 can be in a range from 0.2 nm to 2 nm, although lesser and greater thicknesses can also be employed.

A first magnetic assist layer 162 can be provided on the first nonmagnetic spacer layer 150. The first magnetic assist layer 162 includes a first magnetic material having a first magnetic anisotropy. In one embodiment, the first magnetic assist layer 162 can have a first negative magnetic anisotropy with a sufficiently negative $K_1$ value to provide a first in-plane magnetization for the first magnetic assist layer 162. The in-plane magnetization is a magnetization located within a horizontal plane that is perpendicular to the fixed vertical magnetization direction of the reference layer 132.

In one embodiment, the azimuthally-dependent component of the first magnetic anisotropy of the first magnetic assist layer 162 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy energy per unit volume around a vertical axis that is parallel to the fixed vertical magnetization of the reference layer 132 can be less than ½ times the thermal energy at room temperature. In such cases, the magnetization of the first magnetic assist layer 162 is free to precess within the horizontal plane that is parallel to the interface between the first nonmagnetic spacer layer 150 and the first magnetic assist layer 162 upon application of electrical current through the first magnetic assist layer 162. In one embodiment, the magnetic energy of the first magnetic assist layer 162 may be invariant under rotation of the magnetization of the first magnetic assist layer 162 within the horizontal plane.

In one embodiment, a material having a negative magnetic anisotropy, such as the first magnetic assist layer 162, has a hard magnetization axis that parallel to the direction normal to a major surface of the layer (i.e., the axis is perpendicular to the plane of the layer and parallel to fixed vertical magnetization direction of the reference layer 132), whereas the easy magnetization plane is parallel to the plane of the layer (i.e., the easy magnetization plane is perpendicular to the fixed vertical magnetization direction of the reference layer 132 in FIG. 2). In one embodiment, there is no easy axis direction within the easy magnetization plane.

In one embodiment, the first magnetic assist layer 162 comprises a homogeneous negative magnetic anisotropy material. As used herein, a "homogeneous" material refers to a material having a uniform material composition throughout. In one embodiment, the first magnetic assist layer 162 comprises, and/or consists essentially of, a cobalt-iridium alloy. The material composition of the cobalt-iridium alloy can be selected to provide negative magnetic anisotropy. In one embodiment, the cobalt-iridium alloy can include cobalt atoms at an atomic concentration in a range from 60% to 98%, such as from 70% to 90%, for example 80%, and iridium atoms at the atomic concentration in a range from 40% to 2%, such as from 30% to 10%, for example 20%. In one embodiment, the cobalt-iridium alloy contains only cobalt, iridium and unavoidable impurities. In another embodiment, up to 5 atomic percent of elements other than cobalt and iridium may be added to the alloy. In an illustrative example, a cobalt-iridium alloy having a composition of $Co_{0.8}Ir_{0.2}$ has a $K_1$ value of about $-0.6 \times 10^6 J/m^3$. In another embodiment, the first magnetic assist layer 162 comprises, and/or consists essentially of, a cobalt-iron alloy having a hexagonal crystal structure. The material composition of the cobalt-iron alloy can be selected to provide negative magnetic anisotropy. In one embodiment, the cobalt-iron alloy can include cobalt atoms at an atomic concentration in a range from 80% to 99.8%, such as from 90% to 99.5%, such as 99%, and iron atoms at the atomic concentration in a range from 20% to 0.2%, such as from 10% to 0.5%, for example 1%. In an illustrative example, a cobalt-iron alloy having a composition of $Co_{0.9}Fe_{0.1}$ has a $K_1$ value of about $-0.99 \times 10^6 J/m^3$. The thickness of the first magnetic assist layer 162 can be in a range from 1 nm to 10 nm, such as from 1.5 nm to 6 nm, although lesser and greater thicknesses can also be employed.

In another embodiment, the first magnetic assist layer 162 comprises a multilayer stack that includes multiple repetitions of a first magnetic material layer and a second magnetic material layer. The first magnetic material layer can include, and/or can consist essentially of, a first magnetic material. The second magnetic material layer can include, and/or can consist essentially of, a second magnetic material. The composition and the thickness of each first magnetic material layer and the composition and the thickness of each second magnetic material layer can be selected such that the multilayer stack provides an in-plane magnetization, i.e., a magnetization that is perpendicular to the fixed magnetization direction of the reference layer 132. The first magnetic assist layer 162 can have negative magnetic anisotropy with a sufficiently negative $K_1$ value to provide the first in-plane magnetization for the first magnetic assist layer 162.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the first magnetic assist layer 162 can be in a range from 2 to 20, such as from 4 to 10. In one embodiment, the multilayer stack comprises a periodic repetition of a unit layer stack that includes a first magnetic material layer and a second magnetic material layer.

An antiferromagnetic coupling spacer layer 164 can be located between the first and second magnetic assist layers, such as on the first magnetic assist layer 162 on the opposite side of the first nonmagnetic spacer layer 150, which is located between the free layer 136 and the first magnetic assist layer 162. The antiferromagnetic coupling spacer layer 164 comprises a metallic material that induces Ruderman-Kittel-Kasuya-Yosida (RKKY) coupling interaction between the first magnetic assist layer 152 and a second magnetic assist layer 166 that in one embodiment is located on the antiferromagnetic coupling spacer layer 164. In the RKKY coupling interaction, localized inner d- or f-shell electron spins that define the magnetization direction of a ferromagnetic metal layer interact through the conduction electrons in an intervening nonmagnetic material layer to define a direction of preferred magnetization direction in another ferromagnetic metal layer. The thickness of the antiferromagnetic coupling spacer layer 164 can be selected such that a second in-plane magnetization direction of a second magnetic assist layer 166 is antiparallel to the first in-plane magnetization direction of the first magnetic assist layer 162. In other words, the antiferromagnetic coupling spacer layer 164 can have a thickness within a range that provides antiferromagnetic coupling between a first magnetization direction of the first magnetic assist layer 162 and a second magnetization direction of the second magnetic assist layer 166. In one embodiment, the antiferromagnetic coupling spacer layer 164 comprises, or consists essentially of, ruthenium, and has a thickness within a range from 0.1 nm to 1.0 nm.

A second magnetic assist layer 166 can be provided on the antiferromagnetic coupling spacer layer 164. The second magnetic assist layer 166 includes a second magnetic material having second magnetic anisotropy, which can be the same as or different from the material of the first magnetic assist layer 162. In one embodiment, the second magnetic assist layer 166 can have a second negative magnetic anisotropy with a sufficiently negative $K_1$ value to provide a second in-plane magnetization direction for the second magnetic assist layer 166. The in-plane magnetization direction is a magnetization direction located within a horizontal plane that is perpendicular to the fixed vertical magnetization direction of the reference layer 132.

In one embodiment, the azimuthally-dependent component of the magnetic anisotropy of the second magnetic assist layer 166 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy per unit volume around a vertical axis that is parallel to the fixed vertical magnetization of the reference layer 132 can be less than ½ times the thermal energy at room temperature. In such cases, the magnetization of the second magnetic assist layer 166 is free to precess within the horizontal plane that is parallel to the interface between the antiferromagnetic coupling spacer layer 164 and the second magnetic assist layer 166 upon application of electrical current through the second magnetic assist layer 166. In one embodiment, the magnetic energy of the second magnetic assist layer 166 may be invariant under rotation of the magnetization of the second magnetic assist layer 166 within the horizontal plane.

In one embodiment, the second magnetic assist layer 166 comprises a homogeneous negative magnetic anisotropy material. In one embodiment, the second magnetic assist layer 166 comprises, and/or consists essentially of, a cobalt-iridium alloy or a cobalt-iron alloy described with respect to the first magnetic assist layer 162. The material composition of the cobalt-iridium alloy can be selected to provide negative magnetic anisotropy. In one embodiment, the cobalt-iridium alloy can include cobalt atoms at an atomic concentration in a range from 20% to 80% and iridium atoms at the atomic concentration of the balance. The thickness of the second magnetic assist layer 166 can be in a range from 1 nm to 10 nm, such as from 1.5 nm to 6 nm, although lesser and greater thicknesses can also be employed.

In another embodiment, the second magnetic assist layer 166 comprises a multilayer stack that includes multiple repetitions of a first magnetic material layer and a second magnetic material layer. The first magnetic material layer can include, and/or can consist essentially of, a first magnetic material. The second magnetic material layer can include, and/or can consist essentially of, a second magnetic material. The composition and the thickness of each first magnetic material layer and the composition and the thickness of each second magnetic material layer can be selected such that the multilayer stack provides an in-plane magnetization, i.e., a magnetization that is perpendicular to the fixed magnetization direction of the reference layer 132. The second magnetic assist layer 166 can have negative magnetic anisotropy with a sufficiently negative $K_1$ value to provide the second in-plane magnetization for the second magnetic assist layer 166.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the second magnetic assist layer 166 can be in a range from 2 to 20, such as from 4 to 10. In one embodiment, the multilayer stack comprises a periodic repetition of a unit layer stack that includes a first magnetic material layer and a second magnetic material layer.

Generally, each of the first magnetic assist layer 162 and the second magnetic assist layer 166 can be independently selected from a homogeneous negative magnetic anisotropy material, and a multilayer stack including multiple repetitions of a first magnetic material layer and a second magnetic material layer. In one embodiment, each of the first magnetic assist layer 162 and the second magnetic assist layer 166 can be independently selected from a cobalt-iridium alloy, a cobalt-iron alloy having a hexagonal crystal structure and low iron content, or a multilayer stack including multiple repetitions of a unit stack of a cobalt layer and an iron layer. In one embodiment, at least one of the first magnetic assist layer 162 and the second magnetic assist layer 166 comprises a multilayer stack including a periodic repetition of a unit layer stack, and the unit layer stack includes the first magnetic material layer and the second magnetic material.

In one embodiment, a nonmagnetic capping layer 170 can be located over the second magnetic assist layer 166. The nonmagnetic capping layer 170 can include a non-magnetic, electrically conductive material, such as W, Ti, Ta, WN, TiN, TaN, Ru, and Cu. The thickness of the nonmagnetic capping layer 170 can be in a range from 1 nm to 20 nm, although lesser and greater thicknesses can also be employed.

The layer stack including the material layers from the SAF structure 120 to the nonmagnetic capping layer 170 can be deposited upward or downward, i.e., from the SAF structure 120 toward the nonmagnetic capping layer 170 or from the nonmagnetic capping layer 170 toward the SAF structure 120. The layer stack can be formed as a stack of continuous layers, and can be subsequently patterned into discrete patterned layer stacks for each MRAM cell 180.

MRAM cell 180 can include a first terminal 92 that is electrically connected to or comprises a portion of a bit line 90 (shown in FIG. 1) and second terminal 32 that is electrically connected to or comprises a portion of a word line 30 (shown in FIG. 1). The location of the first and second terminals may be switched such that the first terminal is electrically connected to the SAF structure 120 and the second terminal is electrically connected to the capping layer 170.

Optionally, each MRAM cell 180 can include a dedicated steering device, such an access transistor or diode configured to activate a respective discrete patterned layer stack (120, 140, 150, 162, 164, 166, 170) upon application of a suitable voltage to the steering device. The steering device may be electrically connected between the patterned layer stack and one of the respective word lines 30 or bit lines 90 of the respective MRAM cell 180.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 150, 162, 164, 166, 170) are also contemplated herein.

The magnetization direction of the free layer 136 can be flipped (i.e., from upward to downward or vice versa) by flowing electrical current through the discrete patterned layer stack (120, 140, 150, 162, 164, 166, 170). The magnetization direction of the free layer 136 can precess around the vertical direction (i.e., the direction of the flow of the electrical current) during the programming process until the direction of the magnetization flips by 180 degrees, at which point the flow of the electrical current stops.

The first magnetization direction of the first magnetic assist layer 162 and the second magnetization direction of the second magnetic assist layer 166 are free to precess around a vertical axis that is parallel to the fixed vertical magnetization direction of the reference layer 132 while maintaining an antiferromagnetic alignment therebetween upon application of electrical current through the first magnetic assist layer 162, the antiferromagnetic coupling spacer layer 164, and the second magnetic assist layer 166, e.g., during programming. The fixed vertical magnetization direction of the reference layer 132 maintains a same orientation upon application of electrical current through the reference layer 132.

During operation of the magnetic memory device, electrical current can be flowed through the magnetic tunnel junction 140, the first nonmagnetic spacer layer 150, the first magnetic assist layer 162, the antiferromagnetic coupling spacer layer 164, and the second magnetic assist layer 166.

In one embodiment, the first magnetic assist layer 162, the antiferromagnetic coupling spacer layer 164, and the second magnetic assist layer 166 help keep the electron spin of the free layer more in plane to counteract the spin torque which tilts the electron spin out of the plane. Due to the antiferromagnetic coupling, the anti-ferromagnetic coupled assist film comprising the combination of the first magnetic assist layer 162, the antiferromagnetic coupling spacer layer 164, and the second magnetic assist layer 166 further favors single domains within each layer, thus maintaining a more coherent magnetization during the process of assisting the free layer 136 switching, which is more desired. One additional benefit of this embodiment is that the flux closure within the tri-layer assist film may minimize the stray field from the anti-ferromagnetic coupled assist film on the free layer 136, which will help improve the thermal stability and data retention of the MRAM cell 180.

In one embodiment, the combination of the first magnetic assist layer 162, the antiferromagnetic coupling spacer layer 164, and the second magnetic assist layer 166 is configured to provide an initial non-vertical torque to a magnetization of the free layer during an initial phase of precession of the magnetization of the free layer 136 around a vertical axis that is parallel to the fixed vertical magnetization direction of the reference layer 132 upon initiation of flow of electrical current through the MRAM cell 180. The MRAM cell 180 is configured to provide magnetic coupling between the magnetization direction of the free layer 136 and the first magnetization direction of the first magnetic assist layer 162 during precession of the magnetization direction of the free layer 136 around a vertical axis that is parallel to the fixed vertical magnetization direction of the reference layer 132, and to provide synchronized precession of the first magnetization direction of the first magnetic assist layer 162 and the magnetization direction of the free layer 136 while electrical current flows through the MRAM cell 180.

Figure 3:
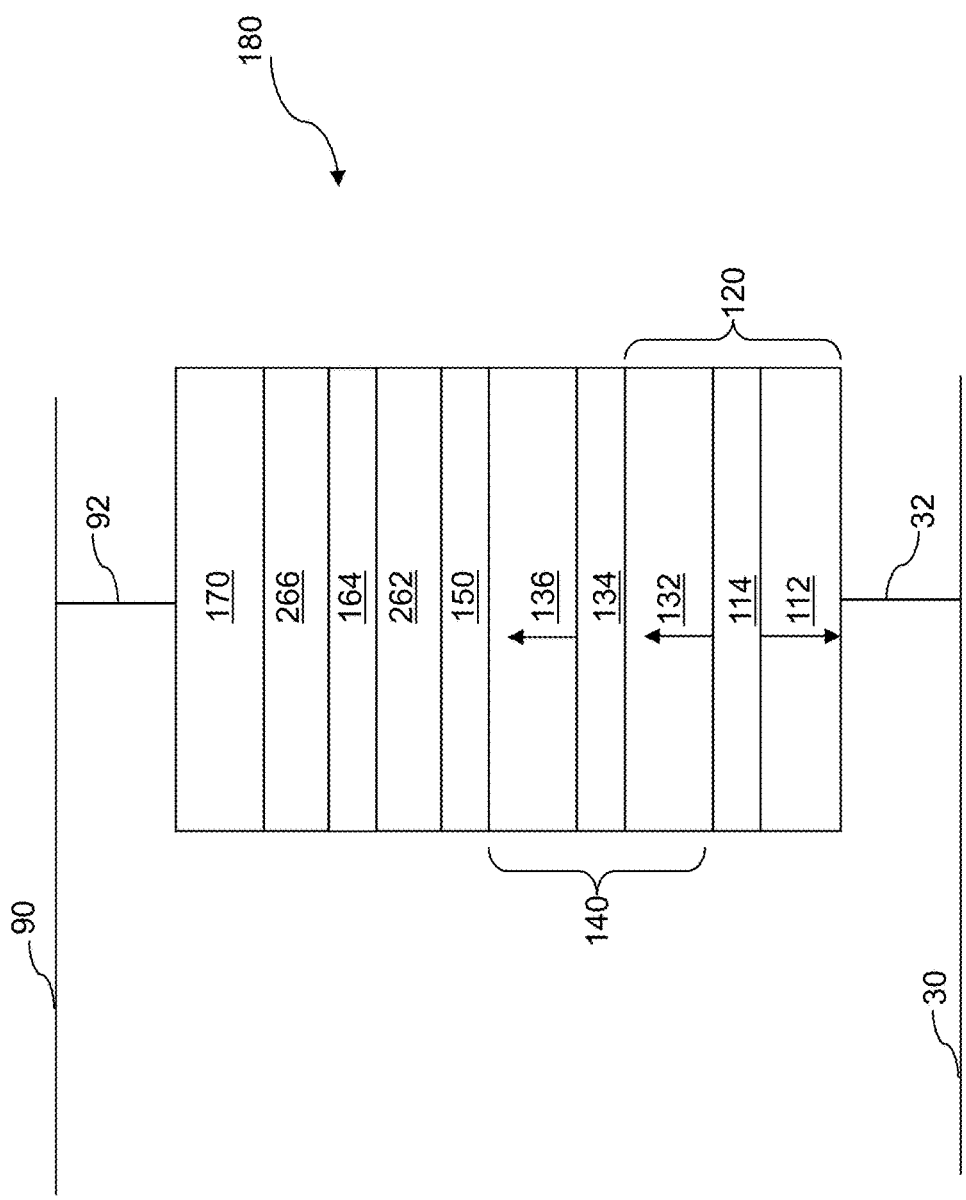
FIG. 3 illustrates a second configuration of an exemplary STT MRAM cell according to an embodiment of the present disclosure.

Referring to FIG. 3, a second configuration of the exemplary spin-transfer torque MRAM cell 180 can be derived from the first configuration of the exemplary spin-transfer torque magnetic memory device illustrated in FIG. 2 by replacing the first magnetic assist layer 162 having the first in-plane magnetization with a first magnetic assist layer 262 including a first ferromagnetic material having no uniaxial magnetic anisotropy, and by replacing the second magnetic assist layer 166 having the second in-plane magnetization with a second magnetic assist layer 266 including a second ferromagnetic material having no uniaxial magnetic anisotropy. In one embodiment, the first and second magnetic assist layers (262, 266) can have a non-uniaxial magnetic anisotropy. As used herein, a "non-uniaxial magnetic anisotropy" refers to a magnetic anisotropy in which the minimum of the magnetic anisotropy energy per volume does not occur at the direction of $\theta=0$, $\theta=\pi$, or $\theta=\pi/2$ for all values of $\phi$. In other words, the orientation of the magnetization in a magnetic film having a non-uniaxial magnetic anisotropy is not a vertical direction that is perpendicular to the plane of a magnetic film or the set of all in-plane directions.

The thickness of the antiferromagnetic coupling spacer layer 164 is selected to provide an antiferromagnetic coupling between the first magnetization of the first magnetic assist layer 262 and the second magnetization with a second magnetic assist layer 266. Thus, the first magnetization of the first magnetic assist layer 262 and the second magnetization of the second magnetic assist layer 266 can be antiferromagnetically coupled. Further, the variations in the magnetic anisotropy energy per volume as a function of spatial orientations of the first and second magnetizations (which remain antiparallel to each other) can be on par with, or less than, the thermal energy at room temperature, i.e., $k_B T$ in which T is 293.15 Kelvin.

Each of the first magnetic assist layer 262 and the second magnetic assist layer 266 comprises a respective soft magnetic material having no uniaxial magnetic anisotropy, which may be the same or different. In one embodiment, each of the first magnetic assist layer 262 and the second magnetic assist layer 266 comprises, and/or consists essentially of, a respective material selected from a CoFe alloy having more than 40 atomic percent iron, such as 45 to 70 atomic percent iron and balance cobalt or an NiFe alloy.

The magnetization direction of the free layer 136 can be flipped (i.e., from upward to downward or vice versa) by flowing electrical current through the discrete patterned layer stack (120, 140, 150, 262, 164, 266, 170). The magnetization direction of the free layer 136 can precess around the vertical direction (i.e., the direction of the flow of the electrical current) during the programming process until the direction of the magnetization direction flips by 180 degrees, at which point the flow of the electrical current stops.

The magnetization direction of the free layer 136 can be programmed by flowing electrical current through the discrete patterned layer stack (120, 140, 150, 262, 164, 266, 170), e.g., from a parallel state that is parallel to the fixed vertical magnetization direction of the reference layer 132 to an antiparallel state that is antiparallel to the fixed magnetization direction of the reference layer 132 or vice versa. The first magnetization direction of the first magnetic assist layer 262 and the second magnetization direction of the second magnetic assist layer 266 are free to precess around a vertical axis that is parallel to the fixed vertical magnetization direction of the reference layer 132 at an angle between 0 degree and 180 degrees with respect to the vertical axis while maintaining an antiferromagnetic alignment therebetween upon application of electrical current through the first magnetic assist layer 262, the antiferromagnetic coupling spacer layer 164, and the second magnetic assist layer 266, e.g., during programming. The tilt angles of the first magnetization direction of the first magnetic assist layer 262 and the second magnetization direction of the second magnetic assist layer 266 during programming is synchronized with the tilt angle of the magnetization direction of the free layer 136 as the tilt angle changes from 0 degrees to 180 degrees or from 180 degrees to 0 degrees with respect to the vertical axis during programming of the MRAM cell 180. The fixed vertical magnetization direction of the reference layer 132 maintains a same orientation upon application of electrical current through the reference layer 132.

During operation of the magnetic memory device, electrical current can be flowed through the magnetic tunnel junction 140, the first nonmagnetic spacer layer 150, the first magnetic assist layer 262, the antiferromagnetic coupling spacer layer 164, and the second magnetic assist layer 266. The combination of the first magnetic assist layer 262, the antiferromagnetic coupling spacer layer 164, and the second magnetic assist layer 266 is configured to provide an initial non-vertical torque to a magnetization direction of the free layer 136 during an initial phase of precession of the magnetization direction of the free layer 136 around a vertical axis that is parallel to the fixed vertical magnetization direction of the reference layer 132 upon initiation of flow of electrical current through the MRAM cell 180. The MRAM cell 180 is configured to provide magnetic coupling between the magnetization direction of the free layer 136 and the first magnetization direction of the first magnetic assist layer 262 during precession of the magnetization direction of the free layer 136 around a vertical axis that is parallel to the fixed vertical magnetization direction of the reference layer 132, and to provide synchronized precession of the first magnetization direction of the first magnetic assist layer 262 and the magnetization direction of the free layer 136 while electrical current flows through the MRAM cell 180.

Figure 4:
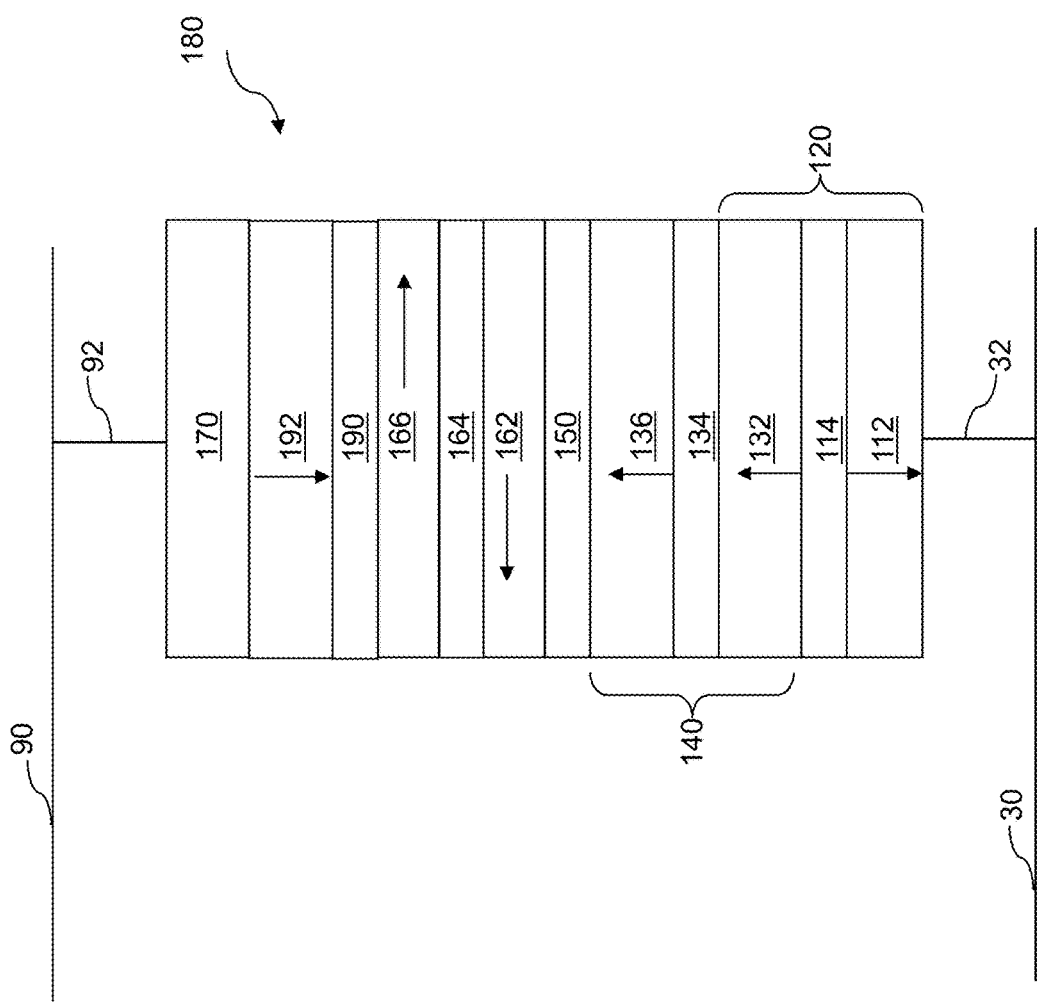
FIG. 4 illustrates a third configuration of an exemplary STT MRAM cell according to an embodiment of the present disclosure.

Referring to FIG. 4, a third configuration of the exemplary spin-transfer torque MRAM cell 180 can be derived from the first configuration of the exemplary spin-transfer torque MRAM cell 180 of FIG. 2 by inserting a second nonmagnetic spacer layer 190 and a pinned magnetization layer 192 between the second magnetic assist layer 166 and the nonmagnetic capping layer 170.

The second nonmagnetic spacer layer 190 can be located on the second magnetic assist layer 166 on the opposite side of the antiferromagnetic coupling spacer layer 164. The second nonmagnetic spacer layer 190 includes a nonmagnetic material such as tantalum, ruthenium, tantalum nitride, copper, copper nitride, or magnesium oxide. In one embodiment, the second nonmagnetic spacer layer 190 can include an electrically conductive material. Alternatively, the second nonmagnetic spacer layer 190 can include a tunneling dielectric material such as magnesium oxide. The thickness of the second nonmagnetic spacer layer 190 can be in a range from 0.2 nm to 2 nm, although lesser and greater thicknesses can also be employed. The second nonmagnetic spacer layer 190 can include the same material as, or can include a material different from, the material of the first nonmagnetic spacer layer 150.

The pinned magnetization layer 192 is a magnetic layer which has a positive uniaxial magnetic anisotropy. In other words, the value of $K_1$ is positive and the term $K_1 \sin^2\theta$ dominates all other higher order terms and terms depending on $\sin(n\phi)$ (or $\cos(n\phi)$) in the magnetic anisotropy energy per volume for the material of the pinned magnetization layer 192. The positive uniaxial magnetic anisotropy of the pinned magnetization layer 192 provides a magnetization that is parallel or antiparallel to the fixed vertical magnetization of the reference layer 132. In one embodiment, the value of $K_1$ for the pinned magnetization layer 192 can be greater than the value of $K_1$ for the free layer 136 such that the magnetization of the pinned magnetization layer 192 stays pinned along the vertical direction, i.e., perpendicular to the interfaces among the various layers of the discrete patterned layer stack (120, 140, 150, 162, 164, 166, 190, 192, 170), during programming of the MRAM cell 180. The magnetization of the pinned magnetization layer 192 may remain parallel to, or antiparallel to, the magnetization of the reference layer 132.

In one embodiment, the pinned magnetization layer 192 can include either a Co/Ni or Co/Pt multilayer structure. The pinned magnetization layer 192 can additionally include a thin non-magnetic layer comprised of tantalum having a thickness of 0.2 nm~0.5 nm and a thin CoFeB layer (having a thickness in a range from 0.5 nm to 3 nm). The pinned magnetization layer 192 can cause the in-plane magnetization of the second magnetic assist layer 166 to oscillate. The out-of-plane oscillation of the magnetization of the second magnetic assist layer 166 can produce a rotating spin torque on the magnetization of the free layer 136 during programming, and thus, can help the switching of the magnetization of the free layer 136 with lesser electrical current through the discrete patterned layer stack (120, 140, 150, 162, 164, 166, 190, 192, 170). In one embodiment, the combination of the magnetization of the pinned magnetization layer 192, the first magnetic assist layer 162, and second magnetic assist layer 166 applies a non-horizontal non-vertical magnetic field (i.e., a field which is neither parallel to not perpendicular to the fixed magnetization direction of the reference layer 132) on the magnetization of the free layer 136 to reduce the magnitude of the required electrical current through the discrete patterned layer stack (120, 140, 150, 162, 164, 166, 190, 192, 170) during switching of the magnetization of the free layer 136.

Figure 5:
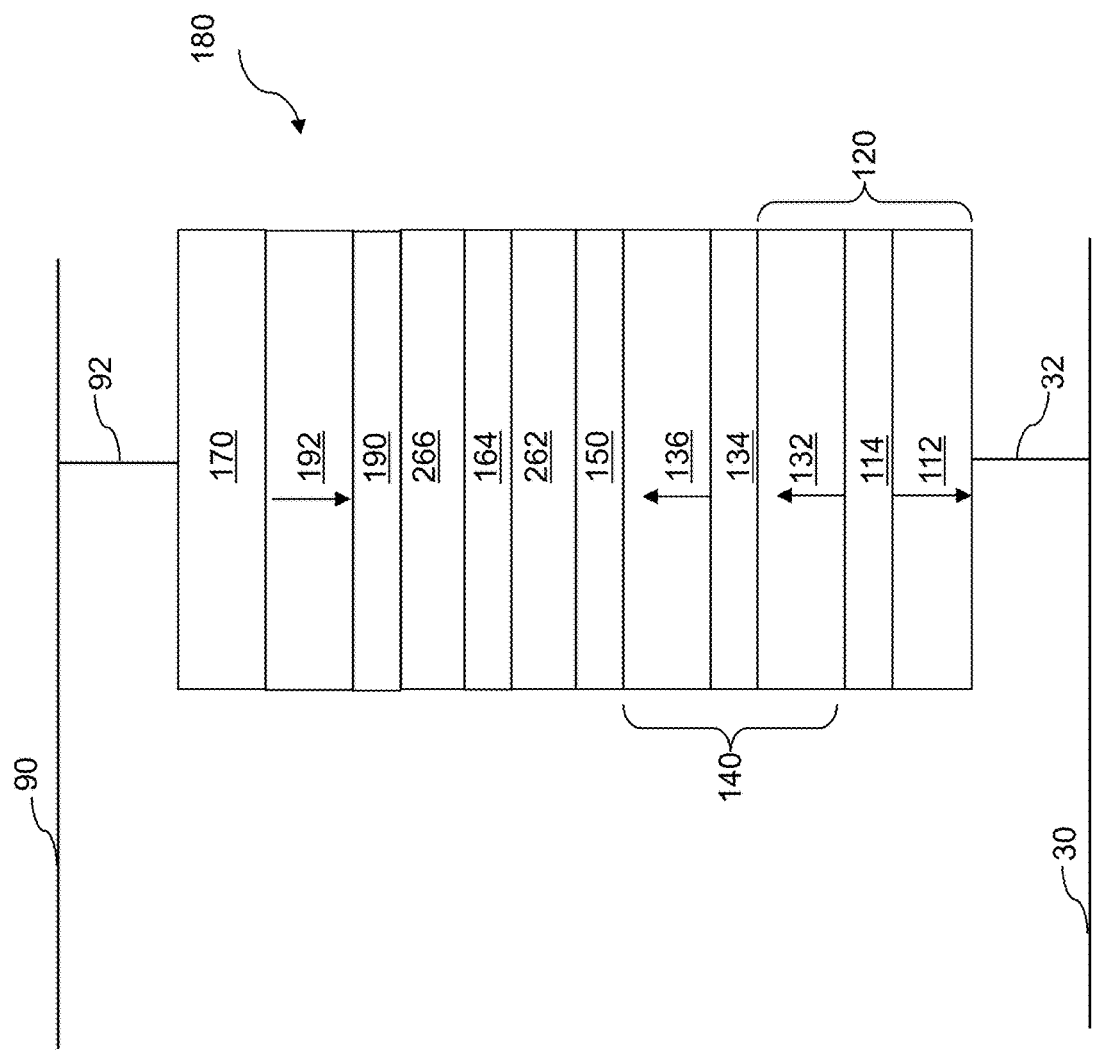
FIG. 5 illustrates a fourth configuration of an exemplary STT MRAM cell according to an embodiment of the present disclosure.

Referring to FIG. 5, a fourth configuration of the exemplary spin-transfer torque MRAM cell 180 can be derived from the third configuration of the exemplary spin-transfer torque magnetic memory device illustrated in FIG. 4 by replacing the first magnetic assist layer 162 having the first in-plane magnetization with a first magnetic assist layer 262 including a first ferromagnetic material having no uniaxial magnetic anisotropy, and by replacing the second magnetic assist layer 166 having the second in-plane magnetization with a second magnetic assist layer 266 including a second ferromagnetic material having no uniaxial magnetic anisotropy.

The thickness of the antiferromagnetic coupling spacer layer 164 is selected to provide an antiferromagnetic coupling between the first magnetization of the first magnetic assist layer 262 and the second magnetization with a second magnetic assist layer 266. Thus, the first magnetization of the first magnetic assist layer 262 and the second magnetization of the second magnetic assist layer 266 can be antiferromagnetically coupled. Further, the variations in the magnetic anisotropy energy per volume as a function of spatial orientations of the first and second magnetizations (which remain antiparallel to each other) can be on par with, or less than, the thermal energy at room temperature, i.e., $k_B T$ in which T is 293.15 Kelvin.

Referring to all configurations of the exemplary spin-transfer torque MRAM cell 180 illustrated in FIGS. 1-5, the exemplary spin-transfer torque MRAM cell 180 can be programmed and read individually. Reading, i.e., sensing, the magnetization state of the free layer 136 can be performed by applying a read bias voltage across the first terminal 92 and the second terminal 32 of a selected discrete patterned layer stack {120, 140, 150, (162 or 262), 164, (166 or 266), 170} or {120, 140, 150, (162 or 262), 164, (166 or 266), (190, 192), 170}. The parallel or antiparallel alignment between the magnetization of the free layer 136 and the reference layer 132 determines the electrical resistance of the selected discrete patterned layer stack in each MRAM cell 180, and thus, determines the magnitude of the electrical current that flows between the first terminal 92 and the second terminal 32. The magnitude of the electrical current can be sensed to determine the magnetization state of the free layer 136 and the data encoded by the detected magnetization state.

Figure 6:
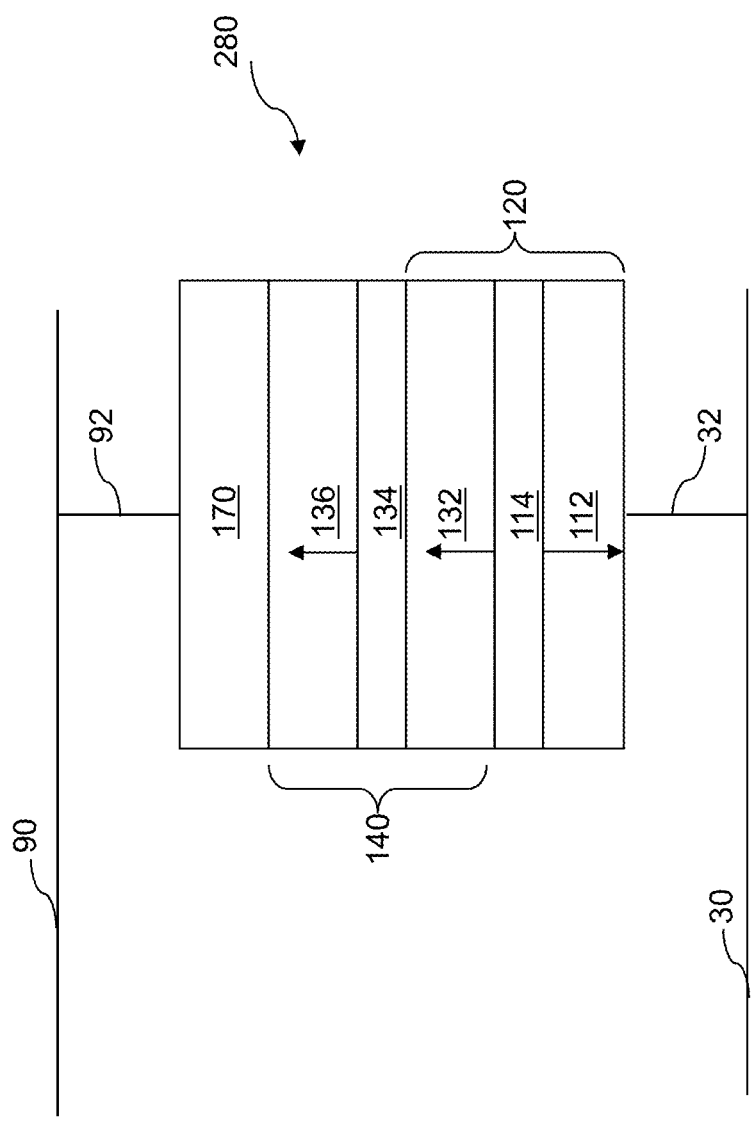
FIG. 6 illustrates a comparative STT MRAM cell.

FIG. 6 illustrates a comparative spin-transfer torque MRAM cell 280 that can be derived from the exemplary spin-transfer torque MRAM cell 180 by omitting all magnetic assist layer (162, 166, 262, 266), the antiferromagnetic coupling spacer layer 164, the second nonmagnetic spacer layer 190, and the pinned magnetization layer 192. Thus, the assist features during precessing of the magnetization of the free layer 136 are absent in the comparative spin-transfer torque MRAM cell 280. The effects of the first and second magnetic assist layer (162, 166) and the antiferromagnetic coupling spacer layer 164 in the first configuration of the exemplary spin-transfer torque MRAM cell 180 are illustrated in FIGS. 7 and 8.

Figure 7:
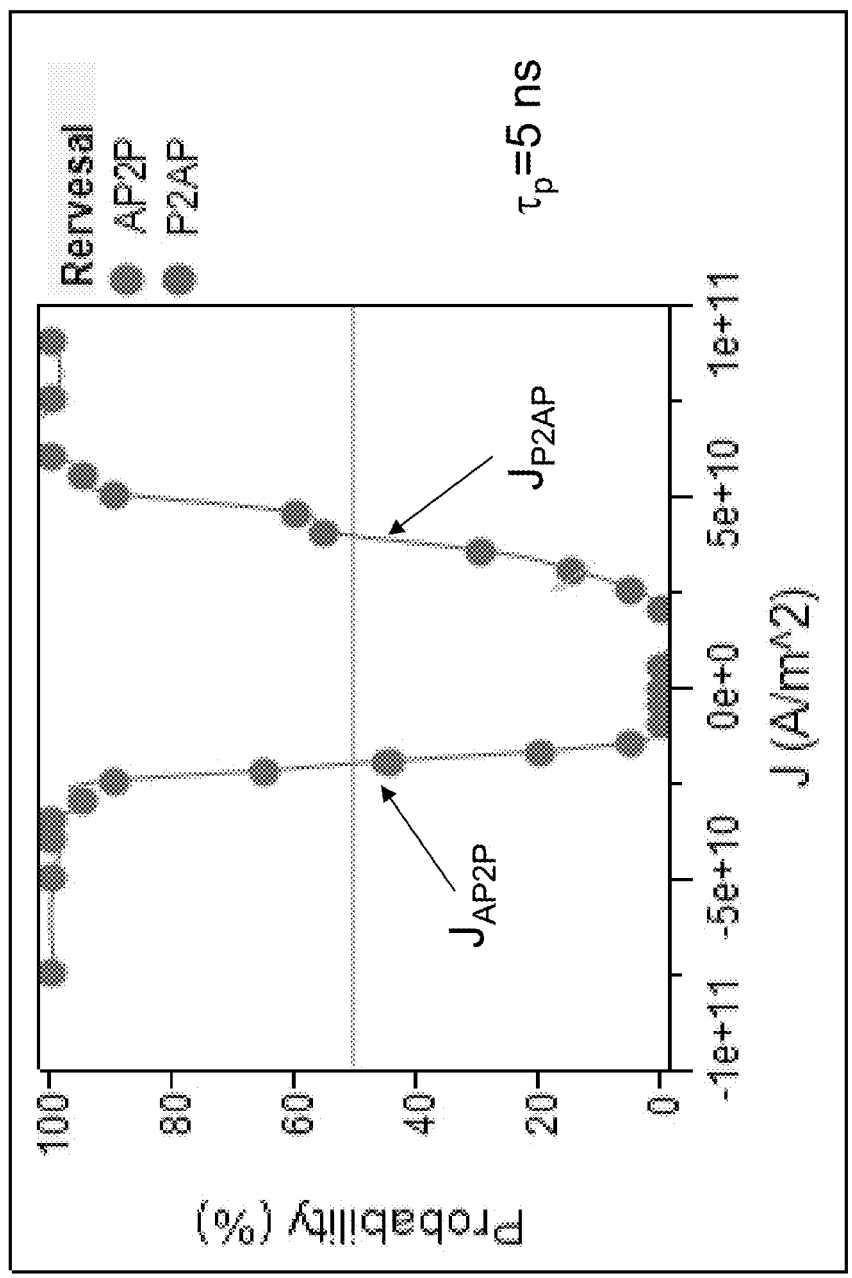
FIG. 7 is a graph illustrating the transition probability as a function of a current density through the comparative STT MRAM cell.
Figure 8:
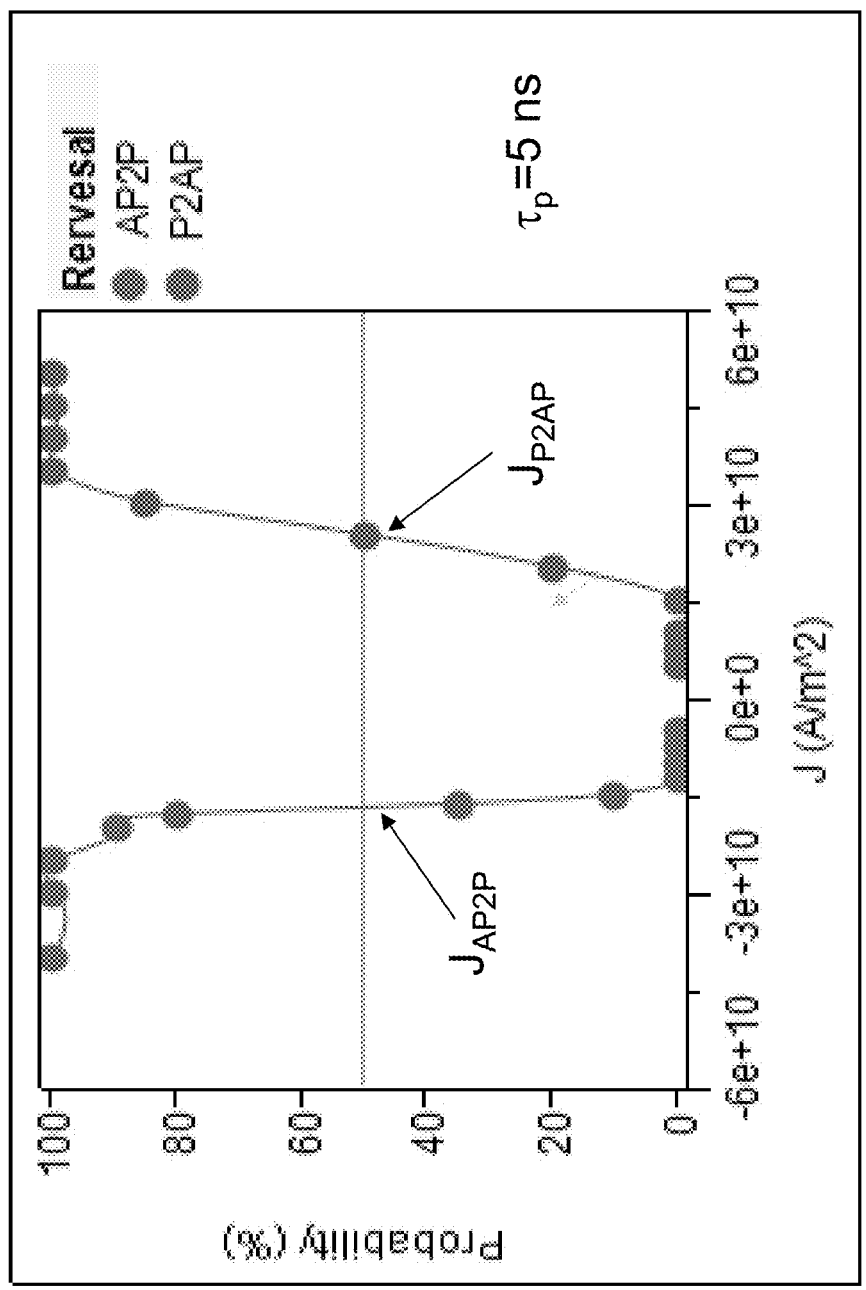
FIG. 8 is a graph illustrating the transition probability as a function of a current density through an exemplary STT MRAM cell of an embodiment of the present disclosure.

FIG. 7 is a graph illustrating the transition probability as a function of a current density through the comparative spin-transfer torque magnetic memory device of FIG. 6. FIG. 8 is a graph illustrating the transition probability as a function of a current density through the first configuration of the exemplary spin-transfer torque magnetic memory device illustrated in FIG. 2. The areas of the devices of FIGS. 7 and 8 are substantially the same.

FIG. 7 shows that the current density of about $3.9 \times 10^{10}$ A/m² is necessary to induce a transition within 5 nanoseconds from a parallel state to an antiparallel state for the magnetization of the free layer 136 and that the current density of about $-2.1 \times 10^{10}$ A/m² is necessary to induce a transition within 5 nanoseconds from an antiparallel state to a parallel state for the magnetization of the free layer 136 for the comparative spin-transfer torque MRAM cell 280 of FIG. 6. FIG. 8 shows that the current density of about $2.5 \times 10^{10}$ A/m² is necessary to induce a transition within 5 nanoseconds from a parallel state to an antiparallel state for the magnetization of the free layer 136 and that the current density of about $-1.68 \times 10^{10}$ A/m² is necessary to induce a transition within 5 nanoseconds from an antiparallel state to a parallel state for the magnetization of the free layer 136 for the exemplary spin-transfer torque MRAM cell 180 of FIG. 2. Thus, FIGS. 7 and 8 illustrate that the presence of the first and second magnetic assist layer (162, 166) and the antiferromagnetic coupling spacer layer 164 in the first configuration of the exemplary spin-transfer torque MRAM cell 180 reduces the required the current density (i.e., the magnitude of the switching current) for making the parallel to antiparallel transition and the current density for making the antiparallel to parallel transition for the first configuration of the exemplary spin-transfer torque MRAM cell 180 by 20 to 30%. Thus, the magnitude of the switching current of the embodiment MRAM cell 180 is reduced by at least 20% compared to the same MRAM cell 280 which lacks the first magnetic assist layer, the antiferromagnetic coupling spacer layer, and the second magnetic assist layer.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A MRAM device, comprising:
a magnetic tunnel junction comprising a reference layer having a fixed magnetization direction, a free layer, and a nonmagnetic tunnel barrier layer located between the reference layer and the free layer;
a first magnetic assist layer;
a second magnetic assist layer;
an antiferromagnetic coupling spacer layer located between the first and second magnetic assist layers, wherein the antiferromagnetic coupling spacer layer is configured to provide antiferromagnetic coupling between a first magnetization direction of the first magnetic assist layer and a second magnetization direction of the second magnetic assist layer; and
a first nonmagnetic spacer layer located between the free layer and the first magnetic assist layer;
wherein the MRAM cell is configured to provide magnetic coupling between a magnetization of the free layer and the first magnetization of the first magnetic assist layer during precession of the magnetization of the free layer around a vertical axis that is parallel to the fixed magnetization direction of the reference layer, and to provide synchronized precession of the first magnetization of the first magnetic assist layer and the magnetization of the free layer while electrical current flows through the MRAM cell.

2. The MRAM cell of claim 1, wherein the first magnetization direction and the second magnetization direction are configured to precess around a vertical axis that is parallel to the fixed magnetization direction of the reference layer while maintaining an antiferromagnetic alignment therebetween upon application of current through the first magnetic assist layer, the antiferromagnetic coupling spacer layer, and the second magnetic assist layer.

3. The MRAM cell of claim 2, wherein:
the free layer has positive magnetic anisotropy to provide bistable magnetization states that include a parallel state having a magnetization that is parallel to the fixed vertical magnetization and an antiparallel state having a magnetization that is antiparallel to the fixed vertical magnetization; and the fixed magnetization direction of the reference layer maintains a same orientation upon application of the current through the reference layer.

4. The MRAM cell of claim 1, wherein:

the first magnetization direction is a first in-plane magnetization that is perpendicular to the fixed magnetization direction of the reference layer; and the second magnetization direction is a second in-plane magnetization that is perpendicular to the fixed magnetization direction of the reference layer.

5. The MRAM cell of claim 1, wherein:

the first magnetic assist layer comprises a first magnetic material having first negative magnetic anisotropy; and the second magnetic assist layer comprises a second magnetic material having second negative magnetic anisotropy.

6. The MRAM cell of claim 5, wherein each of the first magnetic assist layer and the second magnetic assist layer is selected from:

a homogeneous negative magnetic anisotropy material; and a multilayer stack including multiple repetitions of a first magnetic material layer and a second magnetic material layer.

7. The MRAM cell of claim 6, wherein each of the first magnetic assist layer and the second magnetic assist layer comprises a cobalt-iridium alloy comprising 70 to 90 atomic percent cobalt and 10 to 30 atomic percent iridium.

8. The MRAM device of claim 6, wherein each of the first magnetic assist layer and the second magnetic assist layer comprises a cobalt-iron alloy comprising 90 to 99.5 atomic percent cobalt and 0.5 to 10 atomic percent iron.

9. The MRAM cell of claim 5, wherein:

at least one of the first magnetic assist layer and the second magnetic assist layer comprises a multilayer stack including a periodic repetition of a unit layer stack; and the unit layer stack includes the first magnetic material layer and the second magnetic material layer.

10. The MRAM cell of claim 1, wherein each of the first magnetic assist layer and the second magnetic assist layer comprises a respective magnetic material having no uniaxial magnetic anisotropy.

11. The MRAM cell of claim 10, wherein each of the first magnetic assist layer and the second magnetic assist layer comprises a respective material selected from a CoFe alloy having greater than 40 atomic percent iron or an NiFe alloy.

12. The MRAM cell of claim 1, wherein the antiferromagnetic coupling spacer layer comprises a metallic material that induces Ruderman-Kittel-Kasuya-Yosida (RKKY) coupling interaction between the first magnetic assist layer and the second magnetic assist layer.

13. The MRAM cell of claim 12, wherein the antiferromagnetic coupling spacer layer comprises ruthenium and has a thickness within a range from 0.1 nm to 1.0 nm.

14. The MRAM cell of claim 1, further comprising a synthetic antiferromagnetic structure comprising the reference layer, a fixed ferromagnetic layer having a magnetization that is antiparallel to the fixed magnetization direction of the reference layer, and an antiferromagnetic coupling layer located between the reference layer and the fixed ferromagnetic layer.

15. The MRAM cell of claim 1, further comprising:

a pinned magnetization layer having positive uniaxial magnetic anisotropy which provides a magnetization direction that is parallel or antiparallel to the fixed magnetization direction of the reference layer; and a second nonmagnetic spacer layer located between the negative-magnetic-anisotropy assist layer and the pinned magnetization layer.

16. The MRAM cell of claim 1, further comprising a nonmagnetic capping layer located over the second magnetic assist layer.

17. The MRAM cell of claim 1, wherein a combination of the first magnetic assist layer, the antiferromagnetic coupling spacer layer, and the second magnetic assist layer is configured reduce switching current magnitude by at least 20% compared to the same MRAM cell which lacks the first magnetic assist layer, the antiferromagnetic coupling spacer layer, and the second magnetic assist layer.

18. The MRAM cell of claim 1, wherein the MRAM cell is configured to provide magnetic coupling between a magnetization of the free layer and the first magnetization of the first magnetic assist layer during precession of the magnetization of the free layer around a vertical axis that is parallel to the fixed magnetization direction of the reference layer, and to provide synchronized precession of the first magnetization of the first magnetic assist layer and the magnetization of the free layer while electrical current flows through the MRAM cell.

19. A method of operating a MRAM cell, comprising:

providing a MRAM device comprising:

a magnetic tunnel junction comprising a reference layer having a fixed magnetization direction, a free layer, and a nonmagnetic tunnel barrier layer located between the reference layer and the free layer;

a first magnetic assist layer;

a second magnetic assist layer;

an antiferromagnetic coupling spacer layer located between the first and second magnetic assist layers, wherein the antiferromagnetic coupling spacer layer is configured to provide antiferromagnetic coupling between a first magnetization direction of the first magnetic assist layer and a second magnetization direction of the second magnetic assist layer; and a first nonmagnetic spacer layer located between the free layer and the first magnetic assist layer; and flowing a switching current through the magnetic tunnel junction, the first nonmagnetic spacer layer, and the negative-magnetic-anisotropy assist layer to switch a spin state of the free layer.

20. The method of claim 19, wherein a magnitude of the switching current is reduced by at least 20% compared to the same MRAM cell which lacks the first magnetic assist layer, the antiferromagnetic coupling spacer layer, and the second magnetic assist layer.

21. A MRAM device, comprising:

a magnetic tunnel junction comprising a reference layer having a fixed magnetization direction, a free layer, and a nonmagnetic tunnel barrier layer located between the reference layer and the free layer;

a first magnetic assist layer;

a second magnetic assist layer;

an antiferromagnetic coupling spacer layer located between the first and second magnetic assist layers, wherein the antiferromagnetic coupling spacer layer is configured to provide antiferromagnetic coupling between a first magnetization direction of the first magnetic assist layer and a second magnetization direction of the second magnetic assist layer; and a first nonmagnetic spacer layer located between the free layer and the first magnetic assist layer;

wherein a combination of the first magnetic assist layer, the antiferromagnetic coupling spacer layer, and the second magnetic assist layer is configured reduce switching current magnitude by at least 20% compared to the same MRAM cell which lacks the first magnetic assist layer, the antiferromagnetic coupling spacer layer, and the second magnetic assist layer.

22. A MRAM device, comprising:

a magnetic tunnel junction comprising a reference layer having a fixed magnetization direction, a free layer, and a nonmagnetic tunnel barrier layer located between the reference layer and the free layer;

a first magnetic assist layer;

a second magnetic assist layer;

an antiferromagnetic coupling spacer layer located between the first and second magnetic assist layers, wherein the antiferromagnetic coupling spacer layer is configured to provide antiferromagnetic coupling between a first magnetization direction of the first magnetic assist layer and a second magnetization direction of the second magnetic assist layer;

a first nonmagnetic spacer layer located between the free layer and the first magnetic assist layer; and a pinned magnetization layer having positive uniaxial magnetic anisotropy which provides a magnetization direction that is parallel or antiparallel to the fixed magnetization direction of the reference layer; and a second nonmagnetic spacer layer located between the negative-magnetic-anisotropy assist layer and the pinned magnetization layer.

23. A MRAM device, comprising:

a magnetic tunnel junction comprising a reference layer having a fixed magnetization direction, a free layer, and a nonmagnetic tunnel barrier layer located between the reference layer and the free layer;

a first magnetic assist layer;

a second magnetic assist layer;

an antiferromagnetic coupling spacer layer located between the first and second magnetic assist layers, wherein the antiferromagnetic coupling spacer layer is configured to provide antiferromagnetic coupling between a first magnetization direction of the first magnetic assist layer and a second magnetization direction of the second magnetic assist layer; and a first nonmagnetic spacer layer located between the free layer and the first magnetic assist layer;

wherein:

the first magnetic assist layer comprises a first magnetic material having first negative magnetic anisotropy;

the second magnetic assist layer comprises a second magnetic material having second negative magnetic anisotropy; and each of the first magnetic assist layer and the second magnetic assist layer is selected from:
 a homogeneous negative magnetic anisotropy material; and
 a multilayer stack including multiple repetitions of a first magnetic material layer and a second magnetic material layer.

24. The MRAM cell of claim 23, wherein each of the first magnetic assist layer and the second magnetic assist layer comprises a cobalt-iridium alloy comprising 70 to 90 atomic percent cobalt and 10 to 30 atomic percent iridium.

25. The MRAM device of claim 23 wherein each of the first magnetic assist layer and the second magnetic assist layer comprises a cobalt-iron alloy comprising 90 to 99.5 atomic percent cobalt and 0.5 to 10 atomic percent iron.

* * * * *